United States Patent [19]

Scavuzzo

[11] 4,378,508

[45] Mar. 29, 1983

[54] EFL LOGIC ARRAYS

[75] Inventor: Robert J. Scavuzzo, Springfield Township, Bucks County, Pa.

[73] Assignee: Bell Telephone Laboratories, Incorporated, Murray Hill, N.J.

[21] Appl. No.: 191,394

[22] Filed: Sep. 29, 1980

[51] Int. Cl.³ ............... H03K 17/62; H03K 19/086
[52] U.S. Cl. ................................. 307/455; 307/241; 307/248; 307/467
[58] Field of Search ........................... 307/241–246, 307/248, 446, 454–457, 459, 463, 465–467

[56] References Cited

U.S. PATENT DOCUMENTS

| | | | |
|---|---|---|---|
| 3,783,307 | 1/1974 | Breur | 307/243 |
| 3,795,822 | 3/1974 | Skokan | 307/454 |
| 4,041,326 | 8/1977 | Robinson | 307/455 |
| 4,145,623 | 3/1979 | Doucette | 307/289 |
| 4,237,387 | 12/1980 | Devendorf et al. | 307/455 |

OTHER PUBLICATIONS

Skokan, IEEE Journal of Solid–State Circuits; pp. 356–361; vol. SC-8, No. 5; 10/1973.
Kane, IEEE Journal of Solid–State Circuits; pp. 669–678; vol. SC-11, No. 5; 10/1976.

Primary Examiner—Stanley D. Miller
Assistant Examiner—D. Hudspeth
Attorney, Agent, or Firm—Arthur J. Torsiglieri

[57] ABSTRACT

A logic gate is formed as a full 3-EFL circuit including a full two-level ECL current switch tree and an EFL stage made up of input and output multiemitter transistors. By appropriate connections, the logic gate may be used for a variety of circuits including a 4:1 multiplexer and a comparator of two three-digit binary numbers. The logic gate advantageously is formed in a silicon chip which includes an array of cells each consisting essentially of nine single-emitter transistors, two four-emitter transistors and a number, advantageously nine, of resistors.

5 Claims, 5 Drawing Figures

FIG. 5

| | INPUT | | | | | OUTPUT |
|---|---|---|---|---|---|---|
| | $a_1$ | $a_2$ | $b_1$ | A | C | F |
| CIRCUIT NO. 1 | $M_0 \# N_0$ | 0 | 0 | $M_1 \# N_1$ | $M_2 \# N_2$ | M=N |
| CIRCUIT NO. 2 | $M_0 \ \overline{N_0}$ | $M_1$ | $M_2$ | $M_1 \# N_1$ | $M_2 \# N_2$ | M>N |
| CIRCUIT NO. 3 | $\overline{M_0} \ N_0$ | $N_1$ | $N_2$ | $M_1 \# N_1$ | $M_2 \# N_2$ | M<N |

EFL LOGIC ARRAYS

TECHNICAL FIELD

This invention relates to integrated circuits and more particularly relates to a gate which is amenable to iteration in large gate arrays on a single chip and whose versatility makes such a large array useful for a wide variety of applications.

BACKGROUND OF THE INVENTION

Current mode logic (CML) is a logic form well known for use in high-speed digital circuits. Its most popular type emitter-coupled logic (ECL) is frequently integrated into complex logic forms using series-gating techniques in which the differential amplifiers of the basic ECL gates are arranged in a current-switch "tree" configuration. As many as three levels of series gating have been used in commercial devices.

A more recent form of CML is emitter-function logic (EFL) and it has been shown to possess distinct power-display (PXD) advantages over ECL for a number of logic configurations. For example, the basic EFL gate forms an efficient noninverting gate and when used in a series-gated configuration with one level ECL, forms an efficient D-latch and 2:1 multiplexer.

However, such a one-level EFL gate, either alone or in combination with a one-level ECL gate, forms essentially noninverting gates and so lacks versatility; and although the combination can be configured to provide both true and complement variables, such configuration adds wiring and collector-junction capacitances to a critical timing mode, thus degrading performance without adding substantially to the logic flexibility of the gate.

Logic flexibility is particularly important in gate array chips. Bipolar gate array chips typically contain a repetitive arrangement, or iteration, of a large number of identical TTL or ECL logic gates at successive sites in a common silicon chip with the individual sites effectively separated from one another although sharing a common substrate. Desired logic functions are realized by the later discretionary interconnection of these individual gates.

The usefulness of a gate array is determined by the versatility of the logic gates included therein.

SUMMARY OF THE INVENTION

I am proposing as one aspect of my invention a new type of functional logic array which includes a repetitive arrangement of cells which consist of a specified group of partially connected transistors and resistors, so chosen that both single-level gate logic and complex multilevel logic functions can be efficiently formed by the further interconnection of the parts from one or more cells. The functions, or macrocells, are then further interconnected, advantageously by overlay metallizations, to complete the custom logic design. By the use of higher level gates, it is possible to achieve much custom logic with increased efficiency.

In particular, in accordance with one feature of the invention, the cell is particularly adapted for the efficient use of multilevel ECL merged with EFL. In the preferred embodiment, the cell configuration is such as to be readily adaptable to merge two full levels of ECL with one level of EFL to form a gate which will be termed a full 3-EFL gate, which forms a preferred embodiment of the invention. Specifically, the basic cell at each site on the chip consists essentially of two four-emitter transistors, nine one-emitter transistors, and a number, typically, nine of diffused or implanted resistors. The basic cell does not explicitly include diodes, since they can be formed from collector-base shorted transistors. With this cell the single-emitter transistors are primarily used to form a full two-level current switch tree of ECL gates and the four-emitter transistors are used to form the EFL stage in the full 3-EFL embodiment of the invention. This size of cell has proven particularly efficient when fabricated in what is widely known as the standard buried collector (SBC) technology. As this term is understood, this technology involves forming in a chip a plurality of transistors with p-n junction isolation between the transistors, each transistor including emitter and base zones formed in an epitaxial layer overlying a substrate which includes a buried collector zone. It is anticipated that other fabrication technologies may make desirable a different cell size and that with such different cell sizes, the preferred full three-level EFL gate may necessitate two cells for its fabrication.

As will be discussed, the basic 3-EFL gate can be designed to provide a variety of logic functions including a multiplexer and a comparator by appropriate input and output connections.

BRIEF DESCRIPTION OF THE DRAWING

In the drawing;

FIG. 5 shows a table of input and outputs relevant to the three-bit comparator.

DETAILED DESCRIPTION

Figure 1:
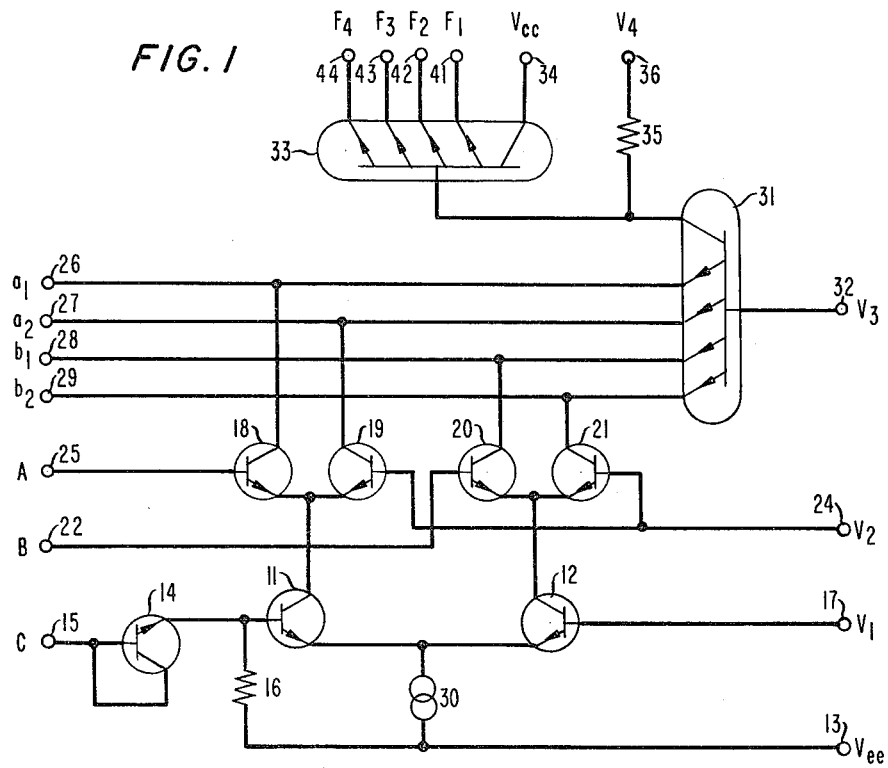
FIG. 1 shows in circuit schematic form a full 3-EFL stage which forms one aspect of the invention.

With reference now to the drawing, in FIG. 1 there is illustrated the basic full 3-EFL gate which is made up of two full levels of ECL and a third level of EFL. It comprises single-emitter transistors 11 and 12 forming a first differential amplifier and the lowest level of the two-level ECL current switch tree. To this end the two emitters are connected together and to one terminal of a current source 30 depicted diagrammatically, the other terminal of which is tied to the voltage supply terminal 13 to be maintained at $V_{ee}$. As known to workers in the art, the current source may be either a resistor, large with respect to other resistances in the current path or a junction transistor connected as an emitter follower with its base connected to a reference voltage node. The use of a current source is intended to make the current flow through the common emitter node relatively independent of the voltage supply $V_{ee}$. The base of transistor 11 is connected by way of transistor 14, connected as a diode, to a first terminal 15 to be supplied with a first control voltage C. Transistor 14 together with resistor 16 serves to shift the input voltage level to the appropriate value for that level of the switching tree. The base of transistor 12 is connected to a voltage supply terminal 17 to be supplied with a reference voltage $V_1$.

The collector of transistor 11 is connected to the common emitter node of transistors 18 and 19 which form a second-level emitter-coupled differential amplifier. Similarly, the collector of transistor 12 is connected to the common emitter node of transistors 20 and 21 which form another second-level differential amplifier. The base of transistor 20 is connected to terminal 22 to which is applied a second control signal B and the base of transistor 21 is connected to terminal 24 to which is supplied a second reference voltage $V_2$. The base of transistor 18 is connected to terminal 25 to which is applied a third control signal A and the base of transistor 19 to terminal 24. The collectors of transistors 18, 19, 20 and 21 are connected to terminals 26, 27, 28 and 29, respectively, to which are applied input signals $a_1$, $a_2$, $b_1$ and $b_2$, respectively. The four emitters of the multiemitter transistor 31, serving as an input emitter follower of the EFL stage, are also connected to the terminals 26, 27, 28 and 29, respectively, while its base is connected to terminal 32 to which is applied a reference voltage $V_3$. The collector of transistor 31 is connected to the base of the four-emitter transistor 33 which is connected as an emitter follower, and serves as the output of the EFL stage. Its collector is connected to voltage supply terminal 34 to which is applied the supply voltage $V_{cc}$. When the transistors are all of the n-p-n type, advantageously terminal 34 will be at ground potential, terminal 13 will be at the most negative potential, and reference voltages $V_3$, $V_2$, and $V_1$ will be increasingly more negative from ground, respectively. It will be advantageous also to connect the base of transistor 33 by way of a pullup resistor 35 to terminal 36 which will be supplied with a reference voltage $V_4$ which will typically be that on terminal 34, although a different value less than that on terminal 34 can be used. Each of the emitters of transistor 33 is connected to its separate output terminal, 41, 42, 43 and 44, respectively.

It can be appreciated that the switching transistors 11, 12, 18, 19, 20 and 21 form a full two-level current switch tree able to select one of the four emitters of the input transistor 31 so that only the signal applied to the input terminal associated with such selected emitter is transmitted via the collector of transistor 31 to the output emitter follower stage made up of transistor 33.

It will be characteristic that the output F at each of output terminals satisfies the Boolean expression $$F=(a_1A+a_2\overline{A})C+(b_1B+b_2\overline{B})\overline{C}.$$

By appropriately relating the variables a wide variety of logic functions are feasible.

In particular, if the four signals from the four input channels to be multiplexed are designated $I_0$, $I_1$, $I_2$ and $I_3$ and if $S_0$ and $S_1$ are the two bits used to select one of the four channels for transmission to the output, a 4 to 1 multiplexer is obtained by supplying $I_0$, $I_1$, $I_2$ and $I_3$ to input terminals 29, 28, 27 and 26, respectively, and supplying $S_0$ simultaneously to both terminals 22 and 25 and $S_1$ to terminal 15. In such a case there results at any of the output terminals 41, 42, 43 and 44 an output given by the Boolean expression $$F=\overline{S_0}\overline{S_1}I_0+\overline{S_0}S_1I_1+\overline{S_0}S_1I_2+S_0S_1I_3$$

The basic 3-EFL circuit is also useful in a comparator for comparing two three-digit binary numbers M and N and providing one of three outputs, the first corresponding to M>N, the second to M<N, and the third to M=N. A three-bit comparator effects the following Boolean algebra $$F(M=N)=(M_2\#N_2)(M_1\#N_1)(M_0\#N_0)$$

$$F(M>N)=M_2\overline{N_2}+M_1\overline{N_1}(M_2\#N_2)+M_0\overline{N_0}(M_2\#N_2)(M_1\#N_1)$$

$$F(M<N)=\overline{M_2}N_2+\overline{M_1}N_1(M_2\#N_2)+\overline{M_0}N_0(M_2\#N_2)(M_1\#N_1)$$

where $M\#N=\overline{MN}+MN$. I have found that the latter two equations may be reformulated as follows $$F(M<N)=[M_0\overline{N_0}(M_1\#N_1)+M_1(\overline{M_1\#N_1})](M_2\#N_2)+M_2(\overline{M_2\#N_2})$$

$$F(M<N)=[\overline{M_0}N_0(M_1\#N_1)+N_1(\overline{M_1\#N_1})](M_2\#N_2)+N_2(\overline{M_2\#N_2})$$

It can be noted that the first and the last two equations conform to the general form $$F=(a_1A+a_2\overline{A})C+(b_1B+b_2\overline{B})\overline{C}$$

with B set equal to logic 1 (high) so that $$F=(a_1A+a_2\overline{A})C+b_1\overline{C}.$$

This setting of B can be provided by simply connecting terminal 22 to terminal 36 by way of a diode to provide a small fixed voltage drop together with a line discharge resistor connected between terminal 22 and terminal 13. Alternatively, the desired function can be provided by the variation shown in FIG. 2 of the basic 3-EFL gate.

Figure 2:
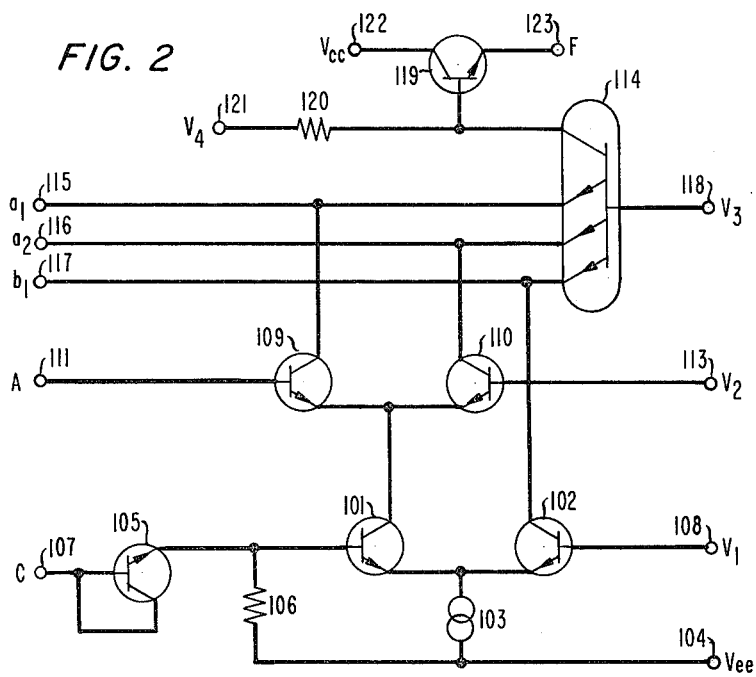
FIGS. 2, 3 and 4 show in schematic forms circuits useful in a three-bit comparator relating to another aspect of the invention.

In FIG. 2, transistors 101 and 102 form an emitter coupled differential amplifier, one input of which is applied by way of diode 105 and resistor 106 from terminal 107 to the base of transistor 101 whereas the base of transistor 102 is connected to terminal 108 which is maintained at the reference voltage $V_1$. The common emitter node of transistors 101 and 102 is connected to one terminal of the current source 103, the other of which is connected to terminal 104 maintained at the supply voltage $V_{ee}$. The other node of resistor 106 is also connected to the terminal 104.

The collector of transistor 101 is connected to the common emitter node of the emitter coupled transistors 109 and 110 forming a second level differential amplifier stage. The base of transistor 109 is supplied by the control terminal 111. The base of transistor 110 is connected to the terminal 113 to which is applied the reference voltage $V_2$. The collectors of transistors 109, 110 and 102 are connected to separate emitters of the multiemitter input transistor 114 and these emitters are also connected to the input terminals 115, 116 and 117, respectively. The base of the transistor 114 is connected to terminal 118 which is maintained at reference voltage $V_3$. The collector of transistor 114 is coupled to the base of the output transistor 119 whose collector is connected to terminal 122 which is maintained at the supply voltage $V_{cc}$. The emitter of transistor 119 is connected to the output terminal 123 at which there becomes available the output function F. The base of transistor 119 is also connected by way of resistor 120 to terminal 120 to which is applied the reference voltage $V_4$.

It is accordingly feasible to achieve the desired three outputs using three circuits of the form shown in FIG. 2 whose inputs are shown in the table of FIG. 5 where a "0" corresponds to a logic low, which corresponds to leaving such terminals open or unconnected to an input. Alternatively, the three circuits may be of the form shown in FIG. 1 with B set at a high as previously discussed.

Figure 3:
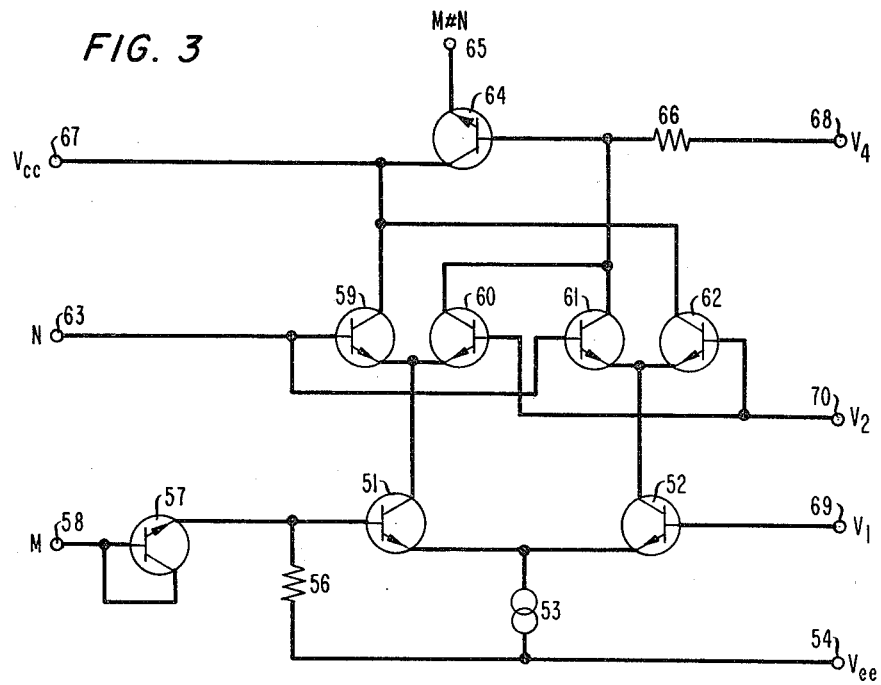

In FIG. 3, there is shown one form of 3-EFL circuit specifically designed for accepting inputs M and N and providing as the output the function M#N useful as an input in the comparator in accordance with this aspect of the invention. It comprises an emitter-coupled pair of transistors 52, 52 forming a first level differential amplifier. The base of transistor 51 is connected to the input terminal 58 by way of the level setting combination formed by resistor 56 and diode 57 as earlier described while the base of transistor 52 is connected to terminal 69 maintained at a reference voltage $V_1$. The common emitter node of the transistors 51 and 52 is connected to one terminal of current source 53 whose other terminal is connected to terminal 54 which is maintained at voltage $V_{ee}$ the most negative voltage in the circuit. The collector of transistor 51 is connected to the common node of emitter-coupled transistors 59, 60 and the collector of transistor 52 is connected to the common node of emitter-coupled transistors 61, 62. The bases of each of transistors 59 and 61 are supplied by way of input terminal 63 with N. The bases of each of transistors 60 and 62 are maintained by way of voltage supply terminal 70 with reference voltage $V_2$ which is appropriately less negative than $V_1$. The collectors of transistors 60 and 61 are coupled together and to the base of output transistor 64 connected as an emitter follower. The collectors of transistors 59 and 62 are coupled together and to terminal 67 which is maintained at the supply voltage $V_{cc}$, the most positive voltage of the circuit, typically ground. A reference voltage $V_4$ is applied to terminal 68 for application to the base of transistor 64 by way of the resistor 66. The collector of transistor 64 is connected to terminal 67. At terminal 65 which is connected to the emitter of transistor 64 there becomes available as the output the function M#N.

Alternatively, the circuit of FIG. 1 can be used with appropriate adjustment of the input and control terminals to yield the same logic as is provided by the circuit of FIG. 3. In particular to this end it is important to provide that the input $a_1$ is maintained at a logic one (high), input $a_2$ be maintained at a logic zero (open), input $b_1$ logic zero and input $b_2$ at a logic one, while N is supplied to both inputs A and B, and C to input C. In this instance to achieve the logic one for inputs $a_1$ and $b_2$, their respective terminals 26 and 29 are simply connected to terminal 36 by way of a diode to provide a small fixed voltage drop below $V_4$.

Figure 4:
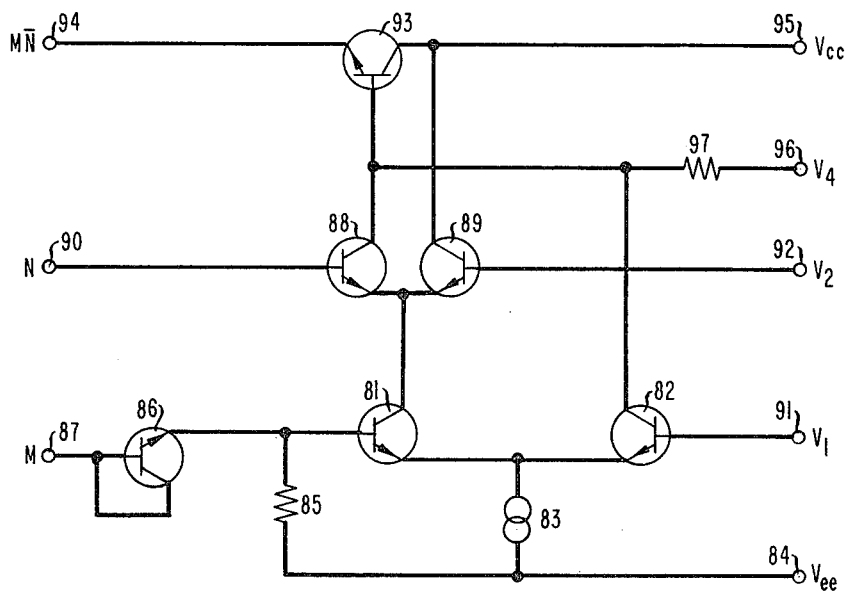

The circuit shown in FIG. 4 can be used for achieving either M$\overline{\text{N}}$ or $\overline{\text{M}}$N by reversing the inputs. It comprises the emitter coupled transistors 81, 82 whose common node is connected to one terminal of current source 83 whose other terminal is connected to terminal 84 maintained at the negative supply voltage $V_{ee}$. For the output M$\overline{\text{N}}$, M is applied to input terminal 87 for supply to the base of the transistor 81 by way of the level setting clamp formed by resistor 85 and diode 86, as previously described. The base of transistor 82 is connected to terminal 91 maintained at the reference voltage $V_1$.

The collector of transistor 81 is connected to the common node of the emitter-coupled transistors 88 and 89. The input N is applied by way of terminal 90 to the base of transistor 88 while the base of transistor 89 is maintained at the voltage $V_2$ by way of terminal 92. The collector of transistor 88 is coupled to the collector of transistor 82 and to the base of the output emitter follower stage provided by transistor 93. The collector of transistor 89 is connected to the collector of transistor 93 and to terminal 95 to which is applied the supply voltage $V_{cc}$. There is also applied to the base of transistor 93 by way of a resistor 97 the voltage $V_4$ supplied to terminal 96. At terminal 94, which is coupled to the emitter of transistor 93 there becomes available the output M$\overline{\text{N}}$.

Moreover, by applying the input N to terminal 87 and the input M to terminal 90, there becomes available at terminal 94 the output $\overline{\text{M}}$N instead.

Alternatively, the circuit of FIG. 1 can be connected to yield the logic M$\overline{\text{N}}$ provided by FIG. 4. In this case, inputs $a_1$, $b_1$ and $b_2$ are kept at a logic zero (open) and input $a_2$ is set at a logic one (high), signal N is used as control A and signal M is applied to control C and control B is maintained at a logic one. To this end, input $a_2$ is maintained at a high in the manner discussed for the logic of FIG. 3 while control B is maintained at a high in the manner discussed for the logic of FIG. 2. The logic $\overline{\text{M}}$N can be achieved by switching M and N as earlier mentioned.

With the interconnection of the circuits shown in FIGS. 3 and 4 to the circuits of FIGs. 1 and 2 to effect a comparator function, there should be added a line discharge resistor to $V_{ee}$ from the output nodes 65 and 94 in the circuits shown in FIGS. 3 and 4 to the appropriate input control nodes 15 or 25 in the circuit of FIG. 1 (107 or 111 in the circuit of FIG. 2). For interconnection to the input nodes 26 through 29 of the circuit shown in FIG. 1 or 115 through 117 of the circuit shown in FIG. 2, such resistor is not needed.

It should be appreciated that the basic cell consisting essentially of two four-emitter transistors, nine one-emitter transistors and a number, typically nine of resistors, advantageously of the known implanted or diffused type, can be used to form a number of circuits, some of which are described in my three contemporaneously filed applications, Ser. Nos. 191,369, 191,393, and 191,395, now U.S. Pat. No. 4,349,753 which are incorporated by reference.

It should also be appreciated that the principles described for providing a full 3-EFL gate can be extended to providing still higher level EFL circuits. Such higher level EFL circuits in turn can be used to provide circuits for comparing numbers of 4 bits or larger or providing higher degrees of multiplexing.

What is claimed is:

1. A logic gate designed to provide an output function F which satisfies the Boolean expression $$F=(a_1A+a_2\overline{A})C+(b_1B+b_2B)\overline{C}$$

where $a_1$, $a_2$, $b_1$, and $b_2$ are input signals and A, B and C are control voltages comprising
  means including an emitter coupled pair of transistors forming a first level differential amplifier, the first of said pair having its base connected to a terminal to which C is to be supplied and the second having its base connected to a terminal to be supplied with a first reference voltage, and each of the emitters being connected to current source means,
  means including a pair of emitter-coupled pairs of transistors forming a second level pair of differential amplifiers, the first transistor of the first of the said second level pair having its base connected to a terminal to which A is to be applied, the second having its base connected to a terminal to be supplied with a second reference voltage, the collector of the first transistor of the first level pair being connected to the common emitter node of the first of the second level pairs of differential amplifiers, the first transistor of the other second level pair having its base connected to a terminal to which B is to be supplied and the second having its base connected to the terminal to be supplied with the second reference voltage, the collector of the second transistor of the first pair being connected to the common emitter node of this other second level pair, a multiemitter input transistor having its first emitter connected to the collector of the first transistor of the first second level pair, its second emitter connected to the collector of the second transistor of the first second level pair, a third emitter connected to the collector of the first transistor of the other second level pair, and a fourth emitter connected to the collector of the second transistor of the other second level pair, a plurality of terminals to be supplied separately with input signals $a_1$, $a_2$, $b_1$, and $b_2$, connected to the first, second, third, and fourth emitters, respectively, of said multiemitter transistor, the base of said multiemitter transistor being connected to a terminal to be supplied with a third reference voltage, and an output transistor having its base connected to the collector of the multiemitter transistor and to a pull-up resistor, its collector to a terminal to be supplied by a voltage supply, and its emitter connected to an output terminal where the output F is to be derived.

2. A multiplexer circuit comprising a logic gate in accordance with claim 1 in which the signals $a_1$, $a_2$, $b_1$ and $b_2$ to be multiplexed are applied separately to the emitters of the input multiemitter transistor and in which the control signals are applied appropriately to the A, B, C terminals.

3. Apparatus for comparing two three-bit numbers which includes apparatus in accordance with claim 1 for providing an output which satisfies the Boolean expression $$F=(a_1A+a_2\overline{A})C+b_1\overline{C}$$

by maintaining B at a logic one.

4. Apparatus for comparing two three-bit numbers in accordance with claim 3 in which the parameters $a_1$, $a_2$, $b_1$, A, B and C are as set forth in the table of FIG. 5.

5. Apparatus forming a full 3-EFL gate comprising
means forming a full two-level ECL current switching tree including a pair of emitter-coupled transistors forming the first level and two pairs of emitter-coupled transistors forming the second level, the emitter of each transistor of the first pair being connected to current source means, each of the three pairs including means for applying a control voltage to the base of one of the transistors of the pair and for applying a reference voltage to the base of the other transistor of the pair, and
means forming an EFL stage including a multiemitter input transistor and an emitter follower output transistor, the collectors of the two pairs of second level transistors of said current switching tree being connected to emitters of said multiemitter input transistor, the stage further including means for applying input signals to be processed also to the emitters, means for applying a reference voltage to the base of said multiemitter input transistor, and means for deriving an output voltage from each of the emitters of the emitter follower output transistor.

* * * * *